(12) United States Patent
Heslinga et al.

(10) Patent No.: US 12,382,731 B2
(45) Date of Patent: Aug. 5, 2025

(54) FUNCTIONAL DEVICE INTEGRATED INTO A TRAVERSABLE SURFACE AND METHOD FOR PRODUCING A TRAVERSABLE SURFACE WITH SAME

(71) Applicants: COMMISSARIAT A L'ENERGIE ATOMIQUE ET AUX ENERGIES ALTERNATIVES, Paris (FR); COLAS, Paris (FR)

(72) Inventors: Dick Heslinga, Grenoble (FR); Amandine Boulanger, Grenoble (FR); Eric Coquelle, Versailles (FR); Rémi De Bettignies, Grenoble (FR); Julien Gaume, Grenoble (FR); Marion Vite, Grenoble (FR)

(73) Assignees: COMMISSARIAT A L'ENERGIE ATOMIQUE ET AUX ENERGIES ALTERNATIVES, Paris (FR); COLAS, Paris (FR)

( * ) Notice: Subject to any disclaimer, the term of this patent is extended or adjusted under 35 U.S.C. 154(b) by 527 days.

(21) Appl. No.: 17/433,762

(22) PCT Filed: Feb. 25, 2020

(86) PCT No.: PCT/FR2020/050359
§ 371 (c)(1),
(2) Date: Aug. 25, 2021

(87) PCT Pub. No.: WO2020/174177
PCT Pub. Date: Sep. 3, 2020

(65) Prior Publication Data
US 2022/0136179 A1 May 5, 2022

(30) Foreign Application Priority Data
Feb. 26, 2019 (FR) .................................. 1901965

(51) Int. Cl.
H10F 19/80 (2025.01)
E01C 7/35 (2006.01)
(Continued)

(52) U.S. Cl.
CPC ........... $H10F\ 19/804$ (2025.01); $H02S\ 20/10$ (2014.12); $H02S\ 20/21$ (2014.12); $H10F\ 19/80$ (2025.01);
(Continued)

(58) Field of Classification Search
CPC ......... H01L 31/048–0488; H02S 20/10; H02S 20/21; H10F 19/80; H10F 19/804; H10F 19/807; H10F 19/85
See application file for complete search history.

(56) References Cited

U.S. PATENT DOCUMENTS 8,907,202 B1 12/2014 Brusaw
2008/0023063 A1* 1/2008 Hayes ............... B32B 17/10743
136/251
(Continued)

FOREIGN PATENT DOCUMENTS

CN 105322039 2/2016
JP 2010526439 A 7/2010
(Continued)

OTHER PUBLICATIONS

International Search Report for PCT/FR2020/050359, dated Jun. 5, 2020, 4 pages.
(Continued)

Primary Examiner — Lindsey A Buck
(74) Attorney, Agent, or Firm — NIXON & VANDERHYE

(57) ABSTRACT

A functional device includes in succession: a first protective film on the front face of the device, with Young's modulus (YM) E1 and thermal dilatation coefficient (TDC) CTE1, a
(Continued)

first exterior encapsulation film, with YM E2 and TDC CTE2, an interior encapsulation film, with YM E3 and TDC CTE3, a second exterior encapsulation film, with YM E4 and TDC CTE4, a second plate on the rear face of the device, with YM E5 and TDC CTE5, E1 and E5 being similar or identical, E2 and E4 being similar or identical, E1>E2 and E4<E5, CTE1 and CTE5 being similar or identical, CTE2 and CTE4 being similar or identical, CTE1<CTE2 and CTE4>CTE5, and one film of the first exterior encapsulation film, the interior encapsulation film and the second exterior encapsulation film encapsulating the active elements; and method for producing a functional traversable surface.

18 Claims, 1 Drawing Sheet

(51) Int. Cl.
- *E01C 17/00* (2006.01)
- *E01F 9/559* (2016.01)
- *H02S 20/10* (2014.01)
- *H02S 20/21* (2014.01)
- *H10F 19/85* (2025.01)
- *H10F 77/70* (2025.01)

(52) U.S. Cl.
CPC ........... *H10F 19/807* (2025.01); *H10F 19/85* (2025.01); *E01C 7/358* (2013.01); *E01C 17/00* (2013.01); *E01F 9/559* (2016.02); *H10F 77/707* (2025.01)

(56) References Cited

U.S. PATENT DOCUMENTS

| | | |
|---|---|---|
| 2008/0264472 A1 | 10/2008 | Cumpston |
| 2014/0311555 A1 | 10/2014 | Harkema et al. |
| 2017/0213925 A1 | 7/2017 | Gaume |
| 2018/0358494 A1* | 12/2018 | Pilat .................... H01L 31/0504 |
| 2019/0312164 A1* | 10/2019 | Sugiyama ............. H01L 31/048 |
| 2020/0204105 A1* | 6/2020 | Wang ........................ E01C 5/20 |
| 2020/0240094 A1* | 7/2020 | Soulima ................... E01C 5/22 |

FOREIGN PATENT DOCUMENTS

| | | |
|---|---|---|
| JP | 2014192395 A | 10/2014 |
| JP | 2017107994 A | 6/2017 |
| JP | 2017525153 A | 8/2017 |
| KR | 20140069219 A | 6/2014 |
| KR | 20170040277 A | 4/2017 |
| WO | 2016/016170 | 2/2016 |
| WO | WO-2018110582 A1 * | 6/2018 ........... H01L 31/048 |

OTHER PUBLICATIONS

Written Opinion of the ISA for PCT/FR2020/050359, dated Jun. 5, 2020, 6 pages.
Office Action, issued in Japanese Patent Application No. 2021-549465 dated Jan. 9, 2024.
Office Action, issued in Korean Patent Application No. 10-2021-7027383_dated Feb. 11, 2025.

* cited by examiner

FUNCTIONAL DEVICE INTEGRATED INTO A TRAVERSABLE SURFACE AND METHOD FOR PRODUCING A TRAVERSABLE SURFACE WITH SAME

This application is the U.S. national phase of International Application No. PCT/FR2020/050359 filed Feb. 25, 2020 which designated the U.S. and claims priority to FR Patent Application No. 1901965 filed Feb. 26, 2019, the entire contents of each of which are hereby incorporated by reference.

TECHNICAL FIELD

The invention relates to a functional device, comprising different layers surrounding active elements, for example photovoltaic cells, integrable into a trafficable pavement. The layers of the functional device have thermomechanical characteristics (Young's modulus and coefficient of thermal expansion) that exhibit, with respect to the central layer of the structure, (i) a symmetry or a quasi-symmetry, and (ii) U-shaped (decreasing/increasing) or inverted U-shaped (increasing/decreasing) gradients, in such a way as to provide the device with a high thermomechanical stability.

The invention finds a privileged application in the field of solar roads. The device is integrable into trafficable pavements, for pedestrians and/or vehicles, motorized or not, such as pavements or roads, bike paths, industrial or airport platforms, squares, sidewalks or parking lots, for example.

The invention also relates to a trafficable pavement functionalized by active elements and its manufacturing method.

STATE OF THE PRIOR ART

Functionalized pavements are pavements comprising active elements such as photovoltaic cells or also electrical, electronic, piezoelectric, thermoelectric and/or wireless communication elements. These elements can be used to capture and/or communicate data, or also to generate and transfer energy. In particular, the solar road principle consists in using roads or pavements as means for producing energy, from solar irradiation during the day, whether to supply buildings located nearby (companies, eco-districts, solar farms, individual houses, among other things), to supply the electricity network and/or traffic assistant devices, for example. The photovoltaic energy produced can also be stored, and be used, for example, for road signs and/or to illuminate parking areas at night. It can also be converted into heat to de-ice roads, sidewalks, parking lots, airports, etc.

For that purpose, solar modules are inserted into so-called trafficable pavements (roads, sidewalks, etc.), and covered with a transparent textured surface, resistant to the passage of vehicles, and meeting the grip requirements applicable to roads and other traffic lanes. Conventionally, the photovoltaic modules comprise:
- a transparent plate on the front face of the module, generally made of glass; the front face being that exposed to the incident solar radiation after implantation of the modules on site,
- a set of interconnected photovoltaic cells, embedded in an encapsulation (multi)layer,
- a glass plate or a multi-layer backsheet on the rear face.

However, for an application of the solar road type, the conventional photovoltaic modules with a glass front face are not flexible enough to conform to the deformation of a road, this deformation being of the order of 5 mm over a typical distance of 1 m for the two horizontal axes, along the width and length, of the road. Moreover, these conventional photovoltaic modules, placed or glued onto a pavement, are not resistant enough to the mechanical loads that they are liable to undergo under the passage of the traffic. For example, the pavement roughness may cause a punching through the rear face of the photovoltaic module. Similarly, a shock or punching, for example by the presence or the fall of objects, may occur through the front face of the module. These mechanisms lead to the risk of breakage of the module or of the photovoltaic cells.

Solutions have been contemplated to improve the resistance to shocks and to mechanical loads and/or the flexibility of the photovoltaic module.

For example, in International Application WO 2018/082609, a conventional photovoltaic panel, having a thick glass plate on the front face, is covered with a rolling layer, comprising an epoxy material and particulate additives, to provide a good anti-skid grip. The panel comprises, on the rear face, an isolating layer, for example made of EVA, epoxy resin, or a polymer/fiberglass composite material to provide protection against rising damp. Documents U.S. Pat. No. 8,907,202 and US 2018/0102730 describe functional devices integrating photovoltaic cells, and other electronic and optical active elements, such as light-emitting diodes. The mechanical protection of the active elements is provided by a glass plate on the front face and a glass plate on the rear face. In order to minimize the front face damages due to the mechanical stresses linked to the shocks and/or the vibration frequency stresses, the front plate may be reinforced glass, covered with diamond or also have a laminated glass structure.

In documents WO2016/016170 and WO2016/016165, the front face of photovoltaic module, comprising photovoltaic cells made of crystalline silicon, a laminate of polymers and composite materials, is a discretized matrix of shock-resistant polymer plates, aligned with the photovoltaic cells. The so-obtained module is flexible and can be integrated on a non-flat surface. However, this technology requires a specific choice of the polymer materials and/or the composite materials that are used, to be able to respond to the mechanical stresses undergone by the modules in real environmental and traffic conditions. Moreover, the front face plates must be positioned opposite the photovoltaic cells, which complicates the method of manufacturing such a device.

However, these solutions are focused on the mechanical resistance of the devices with respect to shocks and/or loads. They do not, or almost not, take into account the climatic conditions to which these devices are subjected.

DISCLOSURE OF THE INVENTION

The object of the present invention is to propose a functional device, able to be integrated into a trafficable pavement, exhibiting structural integrity and functional integrity that are sustainable over time, and this for all climatic/weather conditions and all possible traffic conditions.

For that purpose, the present invention proposes a functional device, in particular integrable into a trafficable pavement, comprising successively:
- a first protective film, also called first protective plate, arranged on the front face of the device, made of a first material,
- a first external encapsulation film, made of a second material,
- an internal encapsulating film, made of a third material, a second external encapsulation film, made of a fourth material, a second protective film, also called second protective plate, arranged on the rear face of the device, made of a fifth material, one of the film, among the first external encapsulation film, the internal encapsulation film and the second external encapsulation film, coating the active elements, the first material, the second material, the third material, the fourth material and the fifth material having Young's moduli $E_1$, $E_2$, $E_3$, $E_4$ and $E_5$, respectively, and coefficients of thermal expansion $CTE_1$, $CTE_2$, $CTE_3$, $CTE_4$ and $CTE_5$, respectively, $E_1$ and $E_5$ being similar or identical, $E_2$ and $E_4$ being similar or identical, $E_1 > E_2$ and $E_4 < E_5$ and advantageously $E_2 > E_3$ and $E_3 < E_4$, $CTE_1$ and $CTE_5$ being similar or identical, $CTE_2$ and $CTE_4$ being similar or identical, $CTE_1 < CTE_2$ and $CTE_4 > CTE_5$ and advantageously $CTE_2 < CTE_3$ and $CTE_3 > CTE_4$.

By similar, it is meant that the values do not differ by more than 30%, preferably they do not differ by more than 20% and advantageously not more than 10%.

Advantageously, the values are identical.

Here and hereinafter, unless otherwise indicated, by "lower" it is meant strictly lower, and by "upper", it is meant strictly upper.

Here and hereinafter, all the Young's moduli and coefficients of thermal expansion values are given at ambient temperature (20-25° C.).

The invention differs fundamentally from the prior art, in particular, by the architecture and the nature of the different layers of the functional device, described hereinabove. The layers of the device form a stack that exhibits:

- a U-shaped Young's modulus gradient: decreasing from the front face first protective film to the external encapsulating layer, and advantageously to the internal encapsulating layer, then increasing from the external encapsulating layer, and advantageously from the internal encapsulating layer to the rear face second protective film,
- an inverted U-shaped coefficient of thermal expansion gradient: increasing from the front face first protective film to the external encapsulating layer, and advantageously to the internal encapsulating layer, then decreasing from the external encapsulating layer, and advantageously from the internal encapsulating layer to the rear face second protective film,
- symmetrical or quasi-symmetrical thermomechanical properties (Young's modulus E and coefficient of thermal expansion CTE) with respect to the central layer of the stack of layers (i.e. the internal encapsulation film): on the one hand, the first protective film/second protective film couple exhibits similar E and CTE values and, on the other hand, the first external encapsulation film/second external encapsulation film couple exhibits similar E and CTE values.

Whatever the exact values of the Young's moduli and the coefficients of thermal expansion of the protective films and external encapsulation films, and whatever their variations as a function of the temperature, the fact that their values are symmetrical or quasi-symmetrical with respect to the central layer of the stack ensures that potential stresses will also be symmetrical between the rear face and the front face, and will hence cancel each other.

This mechanism is all the more efficient since the most rigid materials having the highest Young's moduli are positioned at the two external faces of the stack, which maintain the whole structure, even if the Young's moduli and coefficients of thermal expansion values of the front protective plate or film/rear protective plate or film couple and/or of the first external encapsulation film/second external encapsulation film couple are not perfectly identical. The least thermomechanically stable and softest material (the internal encapsulation film) is at the center of the stack, and hence at the symmetry center. It thus cannot cause a deformation of the stack.

An architecture with such thermomechanical characteristics has a flat appearance that can be maintained over a wide temperature range, notably from −40° C. to +85° C. This temperature range includes all or almost all the conditions to which roads may be exposed. The mechanical deformations due to the high-temperature differential expansions and the low-temperature differential contractions are minimized. The device is not deformed with the variations of temperature.

Moreover, the device includes layers that are continuous and not discontinuous, which simplifies the manufacturing method.

Advantageously, the Young's moduli $E_1$ and $E_5$ are higher than 2 GPa, preferably higher than 5 GPa, and still more preferably higher than 10 GPa. The active elements are mechanically protected, in particular in case of mechanical impact or presence of a heavy load on the device, in particular after application on a trafficable pavement. By way non-limitative illustration, the mechanical impacts may be a punching through the rear face of the device (by the asperities of the underlying trafficable pavement); punching through the front face of the device due to the traffic; mechanical shock on the front face (for example, by impact of hailstones or falling of objects); compression of the device through the front face due to the traffic, the presence of a dead weight, or a falling mass; shearing. The active elements are not degraded, their performance and/or functionality remain intact. In particular, in the case where the active elements are photovoltaic cells, this avoids them to be broken. In the case where the active elements are light-emitting diodes (LEDs), this avoid them to be deteriorated and to have their brightness reduced.

Advantageously, the Young's moduli $E_2$ and $E_4$ are from 100 to 800 MPa and preferably from 150 to 750 MPa, and preferably from 200 to 600 MPa.

Advantageously, the Young's modulus $E_3$ is from 5 to 150 MPa, and preferably from 5 to 100 MPa, and still advantageously from 10 to 100 MPa, or even from 10 to 50 MPa.

Advantageously, the coefficients of thermal expansion $CTE_1$ and $CTE_5$ are lower than $200 \times 10^{-6}/K$, preferably lower than $100 \times 10^{-6}/K$ and still more preferably lower than $50 \times 10^{-6}/K$.

Advantageously, the coefficients of thermal expansion $CTE_2$ and $CTE_4$ are from $200 \times 10^{-6}/K$ to $700 \times 10^{-6}/K$, and preferably from $300 \times 10^{-6}/K$ to $600 \times 10^{-6}/K$.

Advantageously, the coefficients of thermal expansion $CTE_3$ is from $800 \times 10^{-6}/K$ to $2000 \times 10^{-6}/K$, and preferably from $800 \times 10^{-6}/K$ to $1400 \times 10^{-6}/K$.

Advantageously, the first material and the fifth material are identical or different fiberglass/polymer composites.

Advantageously, the second material and the fourth material are identical or different ionomers.

Advantageously, the active elements are protected, by the first and second protective films and by the first and second external encapsulation films, from damp and/or from the fluids usually present in road environment, such as fuels, oils, solvents and/or salt waters. Moreover, the external encapsulation film/internal encapsulation film interfaces are protected from a potential structural degradation due to a penetration of water molecules.

Advantageously, the third material is a thermoplastic polyolefin or an (meth)acrylic resin. This type of material reinforces the protection of active elements with respect to the damp and/or the fluids present in road environment.

Advantageously, the thickness of the first protective film and second protective film is from 0.25 mm to 3.0 mm, and preferably, from 0.5 mm to 1.5 mm.

Advantageously, the thickness of the first external encapsulation film and second external encapsulation film is from 0.2 mm to 2.0 mm, preferably from 0.25 mm to 2.0 mm, still preferably from 0.25 mm to 1.0 mm and advantageously from 0.40 mm to 1 mm.

Advantageously, the thickness of the internal encapsulation film is from 0.4 mm to 2.5 mm, and preferably from 0.4 mm to 2.0 mm, and advantageously from 0.8 mm to 1.4 mm, or even from 0.8 mm to 1.6 mm.

Advantageously, the adhesion force between the first protective film and the first external encapsulation film, between the first external encapsulation film and the internal encapsulation film, between the internal encapsulation film and the second encapsulation film, and/or between the second external encapsulation film and the second protective film is the highest possible. A strong adhesion force makes it possible to minimize the risks of delamination at the interfaces.

Advantageously, the active elements, also called functional elements, are photovoltaic, electric, electronic, optical, opto-electric, piezoelectric, thermoelectric and/or wireless communication elements. In particular, the active elements are photovoltaic, electric, electronic, optical, opto-electric, piezoelectric and/or thermoelectric elements. In particular, the active elements can be photovoltaic cells and/or light-emitting diodes and/or organic light-emitting diodes (OLEDs).

The active elements are coated with at least one of the films, among the first external encapsulation film, the internal encapsulation film and the second external encapsulation film. Each active element can be totally coated with a single film, or be at the interface between two of said films.

The device of the invention is flat and not-curved and can be integrated into a flat trafficable pavement on which pedestrians, cars, bikes and/or trucks pass at low speed and/or high speed. Moreover, the device has a certain degree of flexibility (i.e. it can bend without breaking and the active components won't be deteriorated), which makes it compatible with a trafficable pavement having a slight curvature, which may be of the order of 5 mm over a typical distance of 1 m.

The invention also relates to a functionalized trafficable pavement comprising a trafficable pavement on which a functional device as defined hereinabove is fastened, using a fastening layer, the first plate (or first protective film) of the functional device being covered with a coating layer, to allow the passage of pedestrians and/or vehicles, the coating layer being not opaque and having a textured external surface.

The invention also relates to a method for manufacturing a functionalized trafficable pavement comprising the following steps:

a) providing a functional device as defined hereinabove,
b) fastening the functional device on a trafficable pavement, using a fastening layer,
c) depositing a coating layer, on the first protective film of the functional device, to allow the passage of pedestrians and/or vehicles, the coating layer being not opaque and having a textured external surface.

The order of steps b) and c) may be inverted.

Other features and advantages of the invention will be apparent from the following further description.

It goes without saying that this further description is given only as an illustration of the object of the invention and should in no way be interpreted as a limitation of this object.

BRIEF DESCRIPTION OF THE DRAWINGS

The present invention will be better understood thanks to the reading of the description of exemplary embodiments given only by way of non-limitative illustration, with reference to the appended drawings, in which.

The different parts represented in the figures are not necessarily at a uniform scale, in order to make the figures more readable.

The different possibilities (alternatives and embodiments) must be understood as not being exclusive of each other and can be combined with each other.

DETAILED DISCLOSURE OF PARTICULAR EMBODIMENTS

Hereafter, even if the description refers to a functional device 100 comprising photovoltaic cells 110, the invention is applicable to any device comprising electric, electronic, optical, opto-electric, piezoelectric, thermoelectric and/or wireless communication active elements 110.

Figure 1:
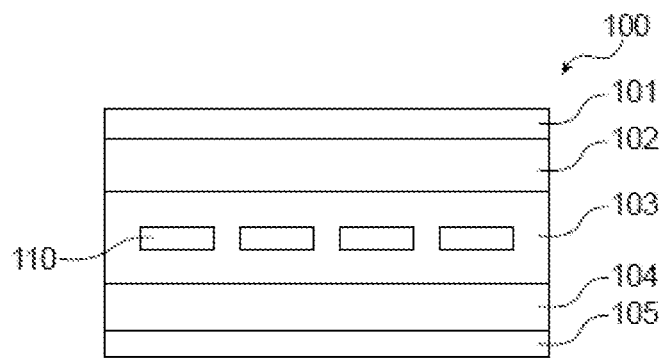
FIG. 1 is a schematical cross-sectional and profile view of a functional device according to a particular embodiment of the invention.
Figure 2:
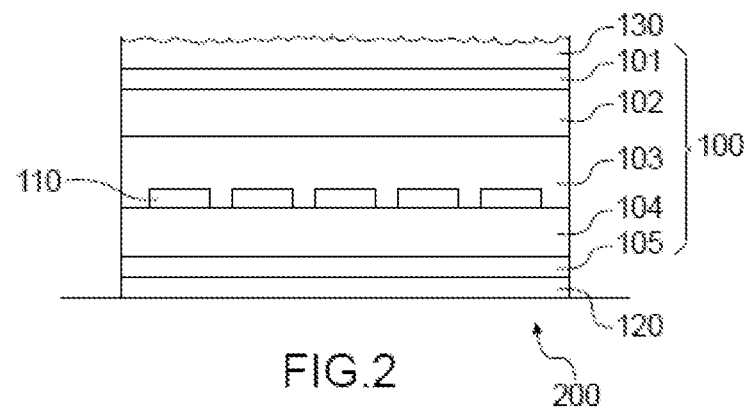
FIG. 2 is a schematical cross-sectional and profile view of a functional device according to another particular embodiment of the invention, and integrated into a functionalized trafficable pavement.

Functional Device 100 Integrable into a Trafficable Area:

Let's refer to FIGS. 1 and 2 that show a functional device 100 integrable into a trafficable area 200. The device 100 comprises successively:

- a first plate also called first protective film 101, arranged on the front face of the device 100, having a first thickness $e_1$, made of a first material, having a first Young's modulus $E_1$ and a first coefficient of thermal expansion $CTE_1$,
- a first external encapsulation film 102, having a second thickness $e_2$, made of a second material, having a second Young's modulus $E_2$ and a second coefficient of thermal expansion $CTE_2$,
- an internal encapsulation film 103, coating photovoltaic cells 110, the internal encapsulation film 103 having a third thickness $e_3$, made of a third material, having a third Young's modulus $E_3$ and a third coefficient of thermal expansion $CTE_3$,
- a second external encapsulation film 104, having a fourth thickness $e_4$, made of a fourth material, having a fourth Young's modulus $E_4$ and a fourth coefficient of thermal expansion $CTE_4$,
- a second plate also called second protective film 105, arranged on the rear face of the device, having a fifth thickness $e_5$, made of a firth material, having a fifth Young's modulus $E_5$ and a fifth coefficient of thermal expansion $CTE_5$.

First Plate 101 and Second Plate 105:

The first plate 101 and the second plate 105 are the elements of the device that are in direct contact with the external environment.

The plates 101, 105 are made of materials having a high Young's modulus. Preferably, their Young's moduli E are higher than 2 GPa, advantageously higher than 5 GPa, still more advantageously higher than 10 GPa. The Young's moduli remain high at least over the whole operating temperature range of the functional device (from −40° C. to +85° C.). This high stiffness can allow reducing, or even preventing, the punching of the photovoltaic cells 110 through the front face or through the rear face of the module, i.e. the appearance of cracks and/or breaks in the photovoltaic cells 110, when applied on a support having a high surface roughness.

The first plate 101 and the second plate 105 have a high mechanical stiffness, are not very deformable and are shock-resistant.

The first plate 101 and the second plate 105 are made of materials having a low coefficient of thermal expansion. Preferably, their coefficients of thermal expansion CTE are lower than $200 \times 10^{-6}$/K, advantageously lower than $100 \times 10^{-6}$/K, and still more advantageously lower than $50 \times 10^{-6}$/K. They have a high dimensional stability under temperature variation. The combination of a high Young's modulus E and a low coefficient of thermal expansion CTE in both plates 101 and 105 provides the thermomechanical stability of the device. Preferably, the Young's moduli of the first plate 101 and second plate 105 are higher than 10 GPa and their coefficients of thermal expansion are lower than $50 \times 10^{-6}$/K.

Advantageously, to avoid having a material that expands more than the other under the effect of heat and/or contracts more than the other under the effect of cold, and hence to avoid inducing inhomogeneous mechanical stresses in the assembly, materials having the closest possible values of Young's modulus (E) and coefficient of thermal expansion CTE will be used for the first plate 101 and the second plate 105. By "closest", it is meant that these values will differ by 0 to 30% maximum, preferably by 0 to 20%, and still preferably by 0 to 10%, and advantageously they are identical.

As both protective plates (or films) 101, 105 are in contact with the external environment, they can also play the role of barriers to the external influences (in particular damp). They advantageously have the following additional characteristics:
- a great resistance to $H_2O$ penetration,
- an intrinsic stability against the structure degradation by $H_2O$ molecules,
- a great resistance to exposure to chemical fluids.

For example, the first 101 and second 105 plates are made of a material having the lowest possible Water Vapor Transmission Rate (WVTR).

Advantageously, the first plate 101 and the second plate 105 are made of a material comprising from 50 to 70 mass % of glass to answer at best to the exigences of the thermomechanical parameters E and CTE.

For example, the first plate 101 and the second plate 105 are made of fiberglass and resin composite materials or glass fiber and polymer composites. For example, it is an epoxy or acrylic resin, a thermoplastic polymer, such as a thermoplastic polyolefin, such as polypropylene (PP), a ionomer, a polyurethan, a polyamide, a polyvinylchloride, a (meth) acrylate, a polycarbonate, a fluoropolymer, or also a polyester such as polyethylene terephthalate (PET or also PETG).

The fiberglass advantageously represents from 50 to 70 mass % and, preferably, 55 to 65 mass % of the material. They can be woven (uni- or bi-directional) or non-woven.

The mechanical protection of the active elements at low temperatures (down to −40° C.) and high temperature (up to +85° C.) is provided, taking into account the hardening or softening of the encapsulating materials, by the mechanical stability of the composite materials. The materials of the first and second plates can be different between each other, provided that they remain similar in terms of E and CTE.

Advantageously, the materials of the first and second plates are identical.

The first plate 101 and the second plate 105 have a thickness from 0.25 to 3.0 mm, advantageously from 0.5 to 1.5 mm.

The first plate 101 and the second plate 105 can have identical or different thicknesses but that remain similar. Advantageously, they have the same thickness.

The first plate 101 on the front face, facing the active faces of the photovoltaic cells, is transparent, in such a way as to let the sun radiation through. By "transparent", it is meant that it lets through more than 70% of the incident radiation, and preferably at least 80%, in the visible spectrum.

The second plate 105 positioned on the rear face can be opaque or transparent.

First External Encapsulation Film 102 and Second External Encapsulation Film 104:

The first external encapsulation film 102 and the second external encapsulation film 104 are made of materials having medium Young's moduli, preferably from 100 to 800 MPa, still preferably from 150 to 750 MPa, more preferably from 200 to 600 MPa.

The external encapsulation films 102, 104 have a medium mechanical stiffness, are medium deformable and shock-resistant.

They are made of materials having a medium coefficient of thermal expansion from $200 \times 10^{-6}$/K to $700 \times 10^{-6}$/K, advantageously from $300 \times 10^{-6}$/K to $600 \times 10^{-6}$/K. They have a medium dimensional stability under temperature variation.

The combination of a medium Young's modulus E with a medium coefficient of thermal expansion reinforces the stabilizing action of the first vertical symmetry obtained by the protective plates (or films), which provides the thermo-mechanical stability of the device. The materials of the external encapsulating films 102, 104 may be different from each other, as long as they remain similar in terms of E and CTE. Advantageously, the external encapsulation films 102, 104 have an E of the order of 500 MPa and a CTE of the order of $400 \times 10^{-6}$/K.

Advantageously, the materials of the external encapsulation films are identical. The external encapsulation films 102, 104 are advantageously made of materials making it possible to reinforce the barrier function of the protective plates (or films) materials, with respect to external influences (in particular with respect to damp).

For example, the external encapsulation films 102, 104 are made of polymers, such as homopolymers or copolymers of ethylene-vinyl acetate (EVA), ethylene-methyl acrylate (EMA), ethylene-butyl acrylate (EBA), ethylene propylene (EPDM), polyvinyl butyral (PVB), polydimethylsiloxanes, polyurethanes (PU), thermoplastic polyolefins, ionomers, polypropylene (PP), polyamide, polyvinyl chloride, polycarbonate, fluoropolymers, or also a polyester such as the polyethylene terephthalate (PET or also PETG). Preferably, it is a ionomer.

The first external encapsulation film 102 and the second external encapsulation film 104 have a thickness from 0.2 mm to 2.0 mm, preferably from 0.25 mm to 2.0 mm, advantageously from 0.4 mm to 1.0 mm and still advantageously from 0.25 mm to 0.75 mm.

Advantageously, they have the same thickness.

Internal Encapsulation Film 103:

The material of the internal encapsulation film 103 has a low Young's modulus, lower than that of the external encapsulation films. Its Young's modulus $E_3$ is from 5 to 150 MPa, preferably from 5 to 100 MPa, advantageously from 10 to 100 MPa, still more advantageously from 10 to 50 MPa. The internal encapsulation film has a low mechanical stiffness, a good deformability so as to be able to absorb mechanical stresses and impacts. The mechanical stability of the whole structure is provided by the other layers of the stack. The material of the internal encapsulation film 103 has a high coefficient of thermal expansion, preferably from 800 to 2000×10/K, still more preferably from 800 to 1400×10/K.

Preferably, the material is characterized by $E_3$ 20 MPa and $CTE_3 \approx 900 \times 10/K$.

The internal encapsulation film 103 is, for example, an encapsulant currently used in the photovoltaic field.

It may be a polymer material, such as homopolymers or copolymers of ethylene-vinyl acetate (EVA), ethylene-methyl acrylate (EMA), ethylene-butyl acrylate (EBA), ethylene propylene (EPDM), polyvinyl butyral (PVB), polydimethylsiloxanes, polyurethanes (PU), thermoplastic polyolefins, ionomers, polypropylene (PP), polyamide, polyvinyl chloride, polycarbonate, fluoropolymers, or also a polyester such as the polyethylene terephthalate (PET or also PETG). It may also be a resin of the (meth)acrylic type, or a heat or photochemically cross-linkable silicone. Preferably, it is a thermoplastic polyolefin (TPO). The internal encapsulation film 103 has a thickness from 0.4 to 2.5 mm, in particular from 0.4 mm to 2.0 mm, advantageously from 0.8 mm to 1.4 mm, in particular from 0.8 to 1.6 mm.

Advantageously, the internal encapsulation film 103 can have a high resistance to $H_2O$ penetration, a great intrinsic stability against the structural degradation by $H_2O$ molecules, as well as a great resistance to exposure to chemical fluids.

Advantageously, the resistance to damp penetration of the different materials increases from the internal encapsulation film 103 towards the protective plates (or films) 101 and 105, on the front face and on the rear face.

Active Elements 110:

The functional device 100 comprises at least one active element 110, and preferably several active elements 110, of same functionality or different functionalities.

According to a first alternative, the active elements 110 are arranged between the internal encapsulation film 103 and the second external encapsulation film 104 (as shown in FIG. 2).

As an alternative, the active elements 110 are arranged between the internal encapsulation film 103 and the first external encapsulation film 102.

Preferably, the active elements 110 are fully coated with and centered in the internal encapsulation film 103 (as shown in FIG. 1).

As another alternative, the active elements could also be coated with the second external encapsulation film 104, in contact with the second protective plate 105.

At the center of the stack, the active elements may not be centered in the internal encapsulation film 103. This does not disturb the thermomechanical stability of the stack, because the latter is provided by the first protective plate 101/second protective plate 105 and first external encapsulation film 102/second external encapsulation film 104 couples, that maintain the structure.

The active elements 110 are for example photovoltaic cells. They are for example based on mono-crystalline, multi-crystalline or quasi-mono-crystalline silicon, also known as "mono-like", silicon. They can be P-type or N-type silicon. The cells are for example in the form of thin plates. Their thickness is advantageously between 100 and 240 μm, for example about 180 to 200 μm. The size of each cell can be compliant with one of the multiple international standards used in the photovoltaic field, such as M0 or M2 standards, for example. For this type of silicon-based cells, the photovoltaic conversion efficiency is typically between 16.0% and 25.0%. The cells may have an architecture of the "conventional" or "derived from conventional" type, for example Alu-BSF ("Aluminum-Back Surface Field"), PERC ("Passivated Emitter Rear Cell"), PERT "Passivated Emitter, Rear Totally Diffused"), or also an alternative such as for example Si-heterojunction, IBC ("Interdigitated Back Contact"), or multi-junction cells. The cells are arranged inside the module surface and interconnected by electrical conductors.

The cells can be arranged side-by-side and, advantageously, regularly spaced apart. The spacing between two neighbor photovoltaic cells can be higher than or equal to 1 mm, and preferably higher than or equal to 3 mm. The two considered neighbor photovoltaic cells can be two neighbor cells of a same series (also called by the term "string") or two neighbor cells belonging to two photovoltaic cell "strings", respectively.

The photovoltaic cells are generally interconnected to each other, by electrically conductive metal connections, intended to collect the electricity generated by the photovoltaic cells. The electrically conductive connectors can be metal connections attached to the connectors (or busbars) of the cell metallization, for example they are copper ribbons or wires. The number of interconnection ribbons is typically from 2 to 6. The set formed by the photovoltaic cells and the connectors forms a skeleton of interconnected photovoltaic cells.

The stack described hereinabove is consisted of five layers 101, 102, 103, 104, 105 surrounding the active elements 110. As an alternative, the stack could comprise an even number of additional layers, for example 2 or 4 additional layers. The additional layers would be chosen in such a way as to also have, two by two, symmetrical or quasi-symmetrical thermomechanical characteristics with respect to the central layer. Advantageously, the additional layers are integrated into the gradients of thermomechanical properties E (U-shaped gradient) and CTE (inverted U-shaped gradient) on either side of the internal encapsulation film.

The symmetry and gradient principles applied to the Young's moduli E and to the coefficients of thermal expansion CTE can be applied to other material parameters, for example the thickness, which will have the beneficial effect of further enhancing the overall thermomechanical stability.

The materials and/or thicknesses of the protective plates or films 101, 105, the external encapsulation films 102, 104 and the internal encapsulation film 103 are chosen in such a way as to obtain a stack in which the key parameters of the materials vary symmetrically, in a favorable and beneficial manner for the dimensional, thermomechanical and physicochemical stability of the stack.

The stack is flat and not curved, while having a certain degree of flexibility, which makes it compatible with a flat or slightly curved trafficable pavement.

Method for Manufacturing the Functional Device 100:

As a first alternative, the internal encapsulation film 103 is obtained from one or several layers of polymer materials as those mentioned hereinabove.

The manufacturing method includes the following successive steps:
  stacking the different layers constituting the stack, in such a way as to form an assembly,
  laminating the assembly.

The lamination step (also called rolling step) makes it possible, non only, to melt then crosslink or polymerize the polymer materials, but also to glue together all the layers and active elements constituting the whole structure.

Each encapsulation film 102, 103 and 104, as well as the protective plates or films 101 and 105, can be obtained from one or several stacked layers of a same material, in order to obtain the desired thickness for each film or plate after the lamination step.

The lamination step is carried out using a laminator device (also called rolling mill), which may be a membrane press.

The lamination method is made in hot state, under vacuum and mechanical pressure. The lamination temperature is between 120° C. and 200° C., and advantageously between 140° C. and 180° C., with an adjustable process time.

According to the nature of the chosen materials, it is possible to carry out one or several lamination steps.

As a second alternative, the internal encapsulation film 103 is obtained from encapsulants in the initial polymerizable liquid form, which are able, during the photovoltaic module formation operation, to be transformed by polymerization or even crosslinking into a flexible rubber solid material, protecting the cells and ensuring the gluing or the cohesion of the assembly.

Integration of the Functional Device 100 into a Trafficable Area 200:

The functional device 100 is integrable to the surface of trafficable pavements—for any rolling means of transport, motorized and/or not-motorized, and/or pedestrian.

The trafficable pavement 200 may be made of various materials and of variable stiffnesses. The trafficable area 200 is advantageously rigid enough not to be more deformed, when a stress corresponding to the passage of traffic is applied, than the functional device 100. For example, it corresponds to an asphalt surface of the pavement type.

The functional device 100 is advantageously fastened to the underlying pavement structure by a fastening layer 120. Advantageously, as the trafficable pavement 200 can exhibit a surface roughness, the use of the fastening layer 120 can allow the smoothing of the pavement surface coming into contact with the rear face of the functional device 100, which limits or even avoids the risk of punching of the photovoltaic cells 110 through the rear face.

The fastening layer 120 can include an adhesive, for example an epoxy, acrylic or polyurethane adhesive, among others.

The fastening layer 120 can include a bituminous binder, potentially reinforced by addition of a polymer such as Styrene-Butadiene-Styrene (SBS), in hot state or in emulsion.

According to an embodiment, the fastening layer 120 is directly spread on the surface of the trafficable pavement, spread as a thin layer, then the functional device 100 is deposited thereon whereas the adhesive is not cured or the bituminous binder is still viscous and sticky. As an alternative, the fastening layer 120 can be deposited on the stack 100, and more particularly on the second plate 105 of the stack 100.

A so-called rolling layer 130, also called coating layer or traffic interface layer, can be applied to the surface of the front face of the device 100 to allow, in particular, the passage of pedestrians and/or vehicles on a non-skid surface. One or more traffic coating layers 130 can be applied.

The coating layer 130 meets the usual adhesion criteria of the road and pedestrian surfaces. Optionally, this rolling layer can also contribute to the protection of the device 100 or even of the active elements 110 inside the device 100.

The coating layer 130 is applied to the front face of the device 100, the coating layer being not opaque, i.e. transparent or translucent, and having an external surface textured in such a way as to be anti-skid, preferably a regularly, or preferably irregularly, macrotextured and microtextured external surface, with a mean texture depth MTD measured according to Standard NF EN 13036-1 ideally comprised between 0.2 mm and 3 mm and a PSV ("Polished Stone Value") according to Standard NF EN 13043 of at least PSV44, better PSV50, even better PSV53. By "irregularly", it is meant that the reliefs of the coating layer 130 have not all the same shape, nor the same size. Advantageously, the mean texture depth MTD of the coating layer 130 can be of at least 0.30 mm, better of at least 0.6 mm.

As an alternative, the texturing can be integrated into the front face of the device 100 during the method of manufacturing thereof, in particular in the first plate or the first protective film 101.

The coating layer 130 can advantageously have an external surface reproducing the texture of a road and trafficable surface coating.

The coating layer 130 advantageously has a transparency rate higher than 50%, preferably higher than 80%, and still preferably higher than 90%, in the spectrum of visible wavelengths.

The coating layer 130 can for example be a bituminous binder as defined in Standard NF EN 12591.

The coating layer 130 can also be a synthetic or plant-based binder, the binder being preferably of organic nature, preferentially of polymeric nature, such as an acrylic, epoxy or polyurethan resin.

The regular or irregular texturing reliefs can be obtained at least partially from non-opaque, i.e. transparent or translucent, texturing elements having suitable shapes, sizes and mechanical and optical characteristics, arranged inside or at the surface of the coating layer. These texturing elements can be balls or granulates, or also mixtures of these latter, calibrated or not-calibrated, of organic or mineral materials, for example polycarbonate, glass or aluminum oxide. They can have a size from 0.1 mm to 10 mm, better from 0.4 to 4 mm, still better from 0.9 to 1.4 mm.

Illustrative and Non-Limitative Examples of an Embodiment

In this example, the device is obtained by stacking and laminating the different layers constituting the stack. The stack comprises, from the front face to the rear face:
  a first plate 101 made of a composite material comprising a bi-directional fiberglass fabric pre-impregnated with a resin of the epoxy type, having a fiberglass rate from 50 to 70 mass %, and a thickness of 0.25 to 3.0 mm, advantageously from 0.5 to 1.5 mm, a first external encapsulation film made of a ionomer, having a thickness from 0.2 mm to 2.0 mm, preferably from 0.25 mm to 1.0 mm, in particular from 0.25 mm to 0.75 mm, advantageously from 0.4 mm to 1.0 mm, an internal encapsulation film made of thermoplastic polyolefin having a thickness from 0.4 mm to 2.5 mm, preferably from 0.4 mm to 2.0 mm, advantageously from 0.8 mm to 1.6 mm, for example from 0.8 mm to 1.4 mm, photovoltaic cells based on crystalline silicon wafers, a second external encapsulation film made of a ionomer of thickness from 0.2 mm to 2.0 mm, preferably from 0.25 mm to 1.0 mm, advantageously from 0.4 to 1.0 mm, or even from 0.25 mm to 0.75 mm, of same thickness as the first external encapsulation film, a second plate made of a composite bi-directional fiberglass/PETG polymer composite material, having a fiberglass rate of 50 to 70 mass %, a thickness from 0.25 to 3.0 mm, advantageously from 0.5 to 1.5 mm.

The different layers are stacked on a glass plate, then hot laminated under vacuum and mechanical pressure.

The stack can be fastened to the trafficable area by an epoxy, polyurethan, bituminous adhesive, or other, with a dosage of the order of 1 kg/m² or higher.

The invention claimed is:

1. A functional device comprising successively:
    a first protective film, arranged on a front face of the device, consisting of a first material;
    a first external encapsulation film, consisting of a second material;
    an internal encapsulation film, consisting of a third material;
    a second external encapsulation film, consisting of a fourth material; and
    a second protective film arranged on the rear face of the device, consisting of a fifth material;
    the internal encapsulation film fully coating active elements,
    the first material, the second material, the third material, the fourth material and the fifth material having Young's moduli $E_1$, $E_2$, $E_3$, $E_4$ and $E_5$, respectively, and coefficients of thermal expansion $CTE_1$, $CTE_2$, $CTE_3$, $CTE_4$ and $CTE_5$, respectively,
    wherein
    $E_1$ and $E_5$ are similar or identical,
    $E_2$ and $E_4$ are similar or identical,
    $E_1 > E_2$ and $E_4 < E_5$,
    $CTE_1$ and $CTE_5$ are similar or identical,
    $CTE_2$ and $CTE_4$ are similar or identical,
    $CTE_1 < CTE_2$ and $CTE_4 > CTE_5$,
    $E_2 > E_3$ and $E_3 < E_4$ and
    $CTE_2 < CTE_3$ and $CTE_3 > CTE_4$.

2. The device according to claim 1, wherein the Young's moduli $E_1$ and $E_5$ are higher than 2 GPa.

3. The device according to claim 1, wherein the Young's moduli $E_2$ and $E_4$ are from 150 to 750 MPa.

4. The device according to claim 1, wherein the Young's modulus $E_3$ is from 5 to 150 MPa.

5. The device according to claim 1, wherein the coefficients of thermal expansion $CTE_1$ and $CTE_5$ are lower than $200 \times 10^{-6}$/K.

6. The device according to claim 1, wherein the coefficients of thermal expansion $CTE_2$ and $CTE_4$ are from $200 \times 10^{-6}$/K to $700 \times 10^{-6}$/K.

7. The device according to claim 1, wherein the coefficient of thermal expansion $CTE_3$ is from $800 \times 10^{-6}$/K to $2000 \times 10^{-6}$/K.

8. The device according to claim 1, wherein the first material and the fifth material are identical or different fiberglass/polymer composites.

9. The device according to claim 1, wherein the second material and the fourth material are identical or different ionomers.

10. The device according to claim 1, wherein the third material is a thermoplastic polyolefin or a (meth)acrylic resin.

11. The device according to claim 1, wherein the thickness of the first protective film and the second protective film is from 0.25 mm to 3.0 mm.

12. The device according to claim 1, wherein the thickness of the first external encapsulating film and the second external encapsulating film is from 0.2 mm to 2.0 mm.

13. The device according to claim 1, wherein the thickness of the internal encapsulating film is from 0.4 mm to 2.5 mm.

14. The device according to claim 1, wherein the active elements are photovoltaic, electric, electronic, optical, optoelectric, piezoelectric, thermoelectric, wireless communication elements, or light-emitting diodes or organic light-emitting diodes.

15. The device according to claim 1, wherein texturing elements are integrated into the first protective film.

16. The device according to claim 1, wherein the Young's moduli $E_1$ and $E_5$ are higher than 5 GPa.

17. A functionalized trafficable pavement, comprising a trafficable pavement on which is fastened the functional device as defined in claim 1, using a fastening layer, the first protective film of the functional device being covered with a coating layer, to allow passage of pedestrians and/or vehicles, the coating layer being not opaque and having a textured external surface.

18. A method for manufacturing a functionalized trafficable pavement comprising the following steps:
    a) providing the functional device as defined in claim 1,
    b) fastening the functional device on a trafficable pavement, through a fastening layer,
    c) depositing a coating layer, on the first protective film of the functional device, to allow passage of pedestrians and/or vehicles, the coating layer being not opaque and having a textured external surface.

* * * * *